US008823126B2

(12) United States Patent  (10) Patent No.: US 8,823,126 B2
Yang et al.  (45) Date of Patent: Sep. 2, 2014

(54) LOW COST BACKSIDE ILLUMINATED CMOS IMAGE SENSOR PACKAGE WITH HIGH INTEGRATION

(75) Inventors: Dan Yang, Hong Kong (HK); Yat Kit Tsui, Hong Kong (HK); Shu Kin Yau, Hong Kong (HK); Pui Chung Law, Hong Kong (HK)

(73) Assignee: Hong Kong Applied Science and Technology Research Institute Company Limited, Hong Kong Science Park Shatin, New Territories, Hong Kong (CN)

( * ) Notice: Subject to any disclaimer, the term of this patent is extended or adjusted under 35 U.S.C. 154(b) by 245 days.

(21) Appl. No.: 13/464,939

(22) Filed: May 4, 2012

(65) Prior Publication Data

US 2013/0292787 A1  Nov. 7, 2013

(51) Int. Cl.
  *H01L 27/146*  (2006.01)
(52) U.S. Cl.
  CPC ...... *H01L 27/1464* (2013.01); *H01L 27/14627* (2013.01)
  USPC .......................................... 257/460
(58) Field of Classification Search
  CPC .................... H01L 27/1464; H01L 27/14636; H01L 27/14618; H01L 27/14627; H01L 27/14621
  See application file for complete search history.

(56) References Cited

U.S. PATENT DOCUMENTS

| 6,110,794 A * | 8/2000 | Liu ............................... 438/407 |
| 2008/0305614 A1 | 12/2008 | Inoue et al. |
| 2013/0242155 A1* | 9/2013 | Oganesian ..................... 348/308 |

FOREIGN PATENT DOCUMENTS

WO  2011028245 A1  3/2011

OTHER PUBLICATIONS

Office Action issued from the State Intellectual Property Office of the People's Republic of China on Apr. 16, 2014.

* cited by examiner

*Primary Examiner* — Tucker Wright
(74) *Attorney, Agent, or Firm* — Ella Cheong Hong Kong; Sam T. Yip

(57) ABSTRACT

This invention discloses a backside illuminated image sensor without the need to involve a mechanical grinding process or a chemical-mechanical planarization process in fabrication, and a fabricating method thereof. In one embodiment, an image sensor comprises a semiconductor substrate, a plurality of light sensing elements in the semiconductor substrate, and a cavity formed in the semiconductor substrate. The light sensing elements are arranged in a substantially planar manner. The cavity has a base surface overlying the light sensing elements. The presence of the cavity allows the image to reach the light sensing elements through the cavity base surface. The cavity can be fabricated by etching the semiconductor substrate. Agitation may also be used when carrying out the etching.

14 Claims, 4 Drawing Sheets

LOW COST BACKSIDE ILLUMINATED CMOS IMAGE SENSOR PACKAGE WITH HIGH INTEGRATION

FIELD OF THE INVENTION

The present invention relates generally to a semiconductor-based image sensor. In particular, the present invention relates to a backside-illuminated image sensor that is semiconductor-based.

BACKGROUND

Semiconductor-based image sensors, such as complementary metal oxide semiconductor (CMOS) image sensors, are commonly used as transducers for transforming visually viewable images into corresponding electrical signals. A semiconductor-based image sensor in general comprises light sensing elements and signal-processing electronics for processing electrical signals generated from the light sensing elements upon capturing an image, where the light sensing elements and the signal-processing electronics are built and integrated in a semiconductor substrate. In a typical realization, the light sensing elements are photodiodes and the signal-processing electronics are realized by CMOS transistors. Many variants of this typical realization are described by Gamal, A. E. and Eltoukhy, H. (2005), "CMOS image sensors," *IEEE Circuits & Device Magazine*, pp. 6-20, May/June 2005, by Bigas, M., Cabruja, E., Forest, J. and Salvi, J. (2006), "Review of CMOS image sensors," *Microelectronics Journal*, pp. 433-451, 2006, and by Ohta, J. (2007), *Smart CMOS Image Sensors and Applications*, CRC Press, 2007, the disclosures of all of which are incorporated herein by reference in their entirety.

The semiconductor substrate has a front side and a backside. The front side is typically grown with a high-quality epitaxial layer on which electronic components such as transistors and diodes are fabricated. It follows that typically the front side is the side on which the light sensing elements and the signal-processing electronics are fabricated. On top of the light sensing elements and the signal-processing electronics, typically there are one or more metallization layers or metal wires inter-separated by insulating dielectric layers.

In one option, an image is received on the front side of the semiconductor substrate of the image sensor, leading to a frontside-illuminated (FSI) image sensor. In this image sensor, the image is required to travel through the metallization layers so that some light energy is reflected back by metal wires therein, thereby reducing the chance of photons being captured by the light sensing elements and hence reducing the sensor sensitivity. This disadvantage can be avoided by using a backside-illuminated (BSI) image sensor. In the BSI image sensor, the backside of the semiconductor substrate is specially treated to remove a substantial amount of semiconductor materials on the backside such that the light sensing elements are located substantially close to the backside surface after treatment. When the light of an image reaches the backside, it only needs to penetrate a small amount of semiconductor materials before reaching the light sensing elements, thereby reducing attenuation of the image. In the art, removal of the substantial amount of semiconductor materials for a BSI image sensor with a conventional structure can be achieved by a mechanical grinding process or a chemical-mechanical planarization (CMP) process. Both of these processes involve precision machine tools to perform precision mechanical steps, and hence is in general costly.

There is a need in the art to have a new BSI image sensor without the need to involve a mechanical grinding process or a CMP process in fabrication.

SUMMARY OF THE INVENTION

A first aspect of the present invention is a BSI image sensor comprising a semiconductor substrate, a plurality of light sensing elements in the semiconductor substrate, and a cavity formed in the semiconductor substrate. The light sensing elements are arranged in a substantially planar manner, thereby forming a substantially planar arrangement of the light sensing elements for receiving the light of an image traveled to the light sensing elements from outside the semiconductor substrate. The cavity has a base surface overlying the light sensing elements. The presence of the cavity allows the image light reaching the light sensing elements through the cavity base surface such that a distance traveled by the image light from outside the semiconductor substrate is shorter than it is if the cavity is absent.

Preferably, the cavity is formed by etching on the semiconductor substrate. The cavity may have a sidewall that is inclined or substantially vertical.

Preferably, the image sensor further comprises a plurality of micro-optical devices on the cavity base surface, wherein each of the micro-optical devices is configured to optically process a portion of the image light and direct the portion of the image light after optical processing to one of the light sensing elements. It is preferable that each of the micro-optical devices comprises a microlens and a color filter.

Preferably, the image sensor further comprises an anti-reflective film on the cavity.

The semiconductor substrate has a first substrate surface and a second substrate surface where the first substrate surface is opposite to the second substrate surface. The cavity is formed in the semiconductor substrate extending from the first substrate surface to the cavity base surface.

Optionally, the image sensor comprises one or more first vias extending from the cavity base surface to the second substrate surface, and one or more first electrical paths between the second substrate surface and the first substrate surface, wherein each of the first electrical paths passes through one of the first vias. Electronic signal communication between one or more of first devices on the second substrate surface and one or more of second devices electrically connectable to the first substrate surface is thereby allowed.

Optionally, the image sensor comprises one or more second vias extending from the first substrate surface to the second substrate surface, and one or more second electrical paths between the second substrate surface and the first substrate surface, wherein each of the second electrical paths passes through one of the second vias. Hence, electronic signal communication between one or more of third devices on the second substrate surface and one or more of fourth devices electrically connectable to the first substrate surface is allowed. It is optional that at least one of the second vias has a substantially uniform cross-sectional area or a substantially non-uniform cross-sectional area.

Preferably, the image sensor further comprises a substantially-transparent cover plate attached to the first substrate surface. Optionally, the substantially-transparent cover plate is a glass plate. It is optional that one or more fifth devices are attached to the substantially-transparent cover plate and that the substantially-transparent cover plate includes one or more third vias, such that electrical connection can be made between the one or more fifth devices and electronic circuits on the second substrate surface. A high degree of device integration is thereby achieved.

Optionally, the image sensor further comprises a handling substrate attached to the second substrate surface to thereby provide additional mechanical support to the image sensor.

According to a second aspect of the present invention, a method for fabricating the disclosed BSI image sensor comprises: preparing a wafer having a second wafer side on which integrated circuits are fabricated, and a first wafer side opposite to the second wafer side, wherein the integrated circuits comprise at least light sensing elements, electronic circuits, and metal wires for at least interconnecting one or more of the electronic circuits with one or more of the light sensing elements; attaching a wafer-size handling substrate to the wafer on the second wafer side; etching the first wafer side such that the first wafer side is reshaped to form a plurality of cavities thereon; forming a plurality of vias from the first wafer side to the second wafer side; forming electrical paths between the first wafer side and the second wafer side, wherein each of the electrical paths passes through one of the vias; forming a plurality of anti-reflective films on the first wafer side, and a plurality of micro-optical devices on the cavities; and performing passivation and then dicing, whereby a die being obtained after the dicing is the image sensor and the image sensor has a handling substrate which is a portion of the wafer-size handling substrate.

Optionally, the step of etching the first wafer incorporates agitation when the etching is performed. The method may further comprise attaching a substantially-transparent cover plate to the image sensor.

BRIEF DESCRIPTION OF THE DRAWINGS

Embodiments of the invention are described in more detail hereinafter with reference to the drawings, in which.

DETAILED DESCRIPTION

In the following description, structure and methods of production of low-cost backside illuminated CMOS image sensor page with high integration are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

As used herein in the specification and in the appended claims, the term "via" is used in a broad sense to mean any opening in an electrical material layer or layers that allow a conductive connection between layers. Various other similar terms such as trench or channel are encompassed by the term "via" as used in describing the present invention.

For simplicity in illustration, a silicon-on-insulator (SOI) configuration is considered in the description of a structure of a BSI image sensor disclosed herein. However, the present invention is not limited to the SOI configuration. With the disclosure herein, fabricating the structure of the disclosed BSI image sensor by other configurations is apparent to an ordinary person skilled in the art. Semiconductor processes relevant to fabricating the disclosed BSI image sensor are described by Plummer, J. D., Deal, M. and Griffin, P. D. (2000), *Silicon VLSI Technology: Fundamentals, Practice, and Modeling*, Prentice Hall, 2000, the disclosure of which is incorporated by reference herein.

Figure 1:
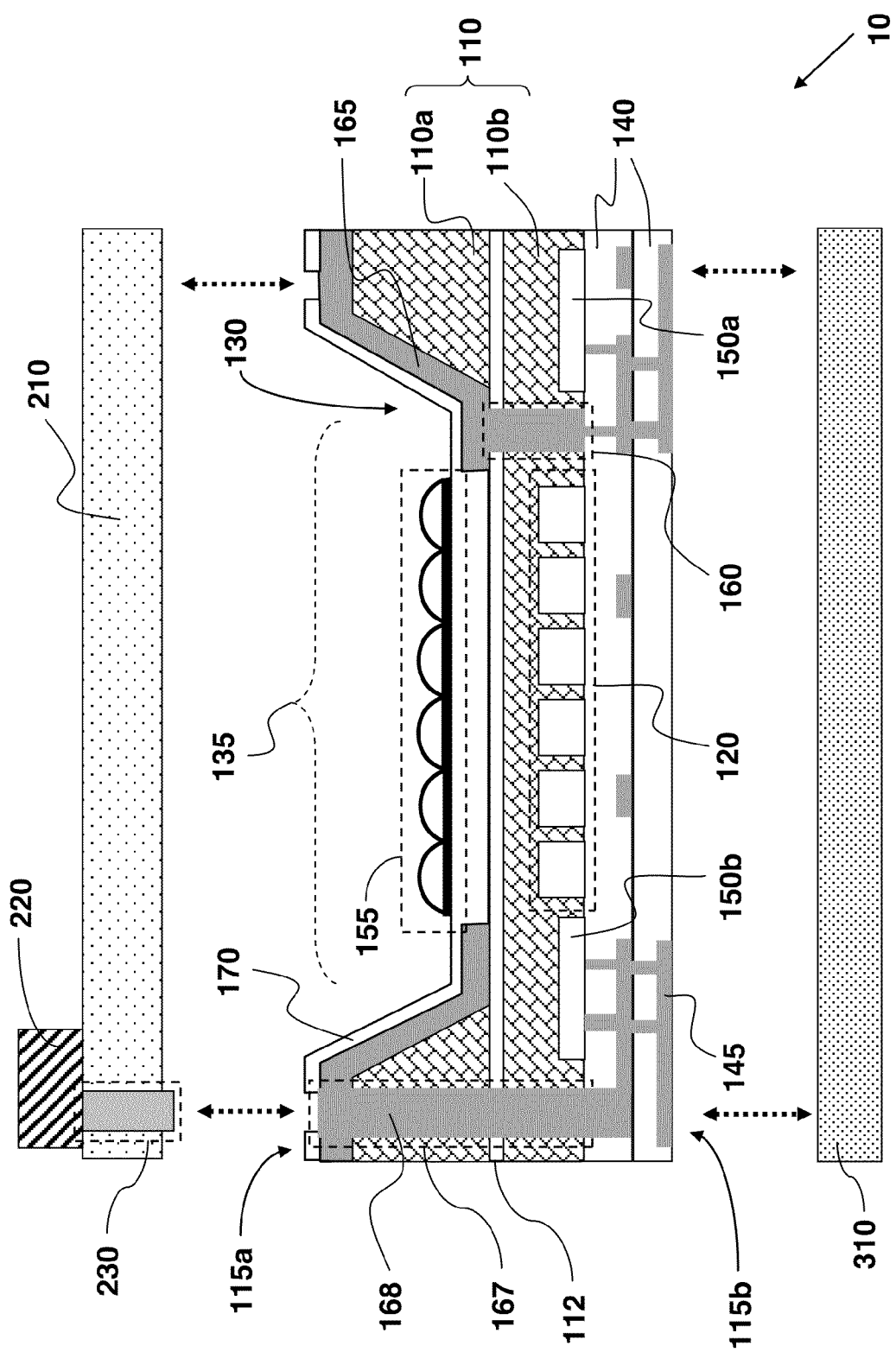
FIG. 1 depicts an exemplary embodiment of a BSI image sensor disclosed in the present invention.

A first aspect of the present invention is a BSI image sensor. An exemplary embodiment of this image sensor is shown in FIG. 1. A BSI image sensor 10 comprises a semiconductor substrate 110. Furthermore, the image sensor 10 comprises a plurality of light sensing elements 120 in the semiconductor substrate 110. The light sensing elements 120 are arranged in a substantially planar manner to thereby form a substantially planar arrangement of the light sensing elements 120 for receiving an image traveled from outside the semiconductor substrate 110. The light sensing elements 120 are configured to convert light energy carried in the image into electrical signals. An example of the plurality of light sensing elements 200 is an array of photodiodes as used in a CMOS image sensor. The image sensor 10 further comprises a cavity 130 formed in the semiconductor substrate 110. In addition, the cavity 130 has a base surface 135 overlying the light sensing elements 120. Due to presence of the cavity 130, the image light is allowed to reach the light sensing elements 120 through cavity base surface 135 such that a distance traveled by the image light from outside the semiconductor substrate 110 is shorter than it is if the cavity 130 is absent.

Preferably, the image sensor 10 comprises a plurality of micro-optical devices 155 on the cavity base surface 135. Each of the micro-optical devices 155 is configured to optically process a portion of the image and direct the portion of the image after optical processing to one of the light sensing elements 120. It is preferable that each of the micro-optical devices 155 comprises a microlens and a color filter. The microlens is used to direct the portion of image onto said one of the light sensing elements 120. The color filter enables said one of the light sensing elements 120 to detect a desired color component, e.g., red, green or blue, of the portion of the image.

As a SOI configuration is used in the illustration of the exemplary embodiment, the semiconductor substrate 110 comprises a bulk 110a, serving as the sidewalls of the cavity 130, and an active region 110b separated by a buried insulator 112. One example of the buried insulator 112 is silicon dioxide.

Figure 3:
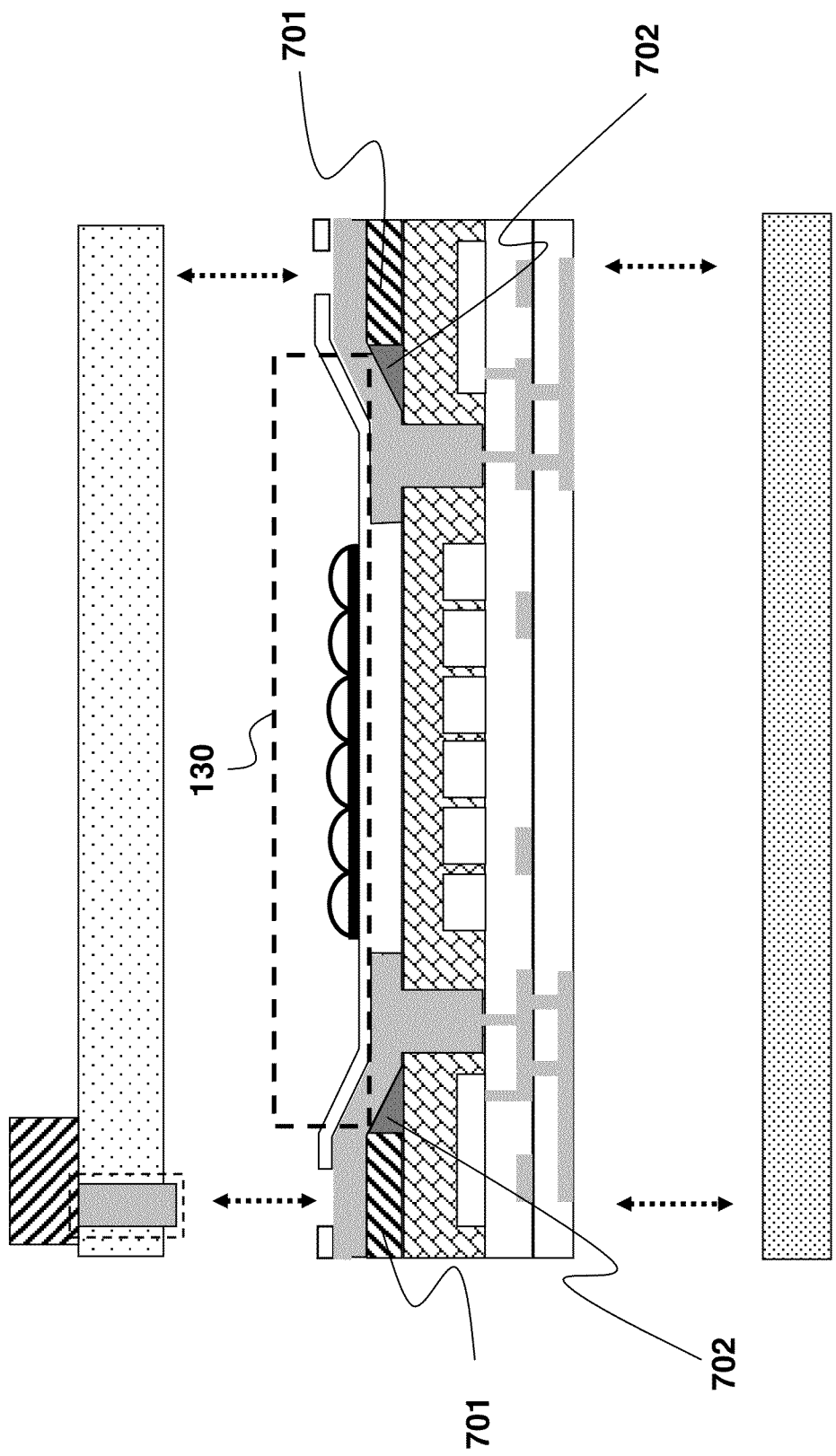
FIG. 3 depicts another exemplary embodiment of a BSI image sensor disclosed in the present invention.

In another exemplary embodiment as shown in FIG. 3, rings of stoppers 701 are used in place of the bulk 110a to isolate each of the cavities. Along with the residual bulk 702, they form the sidewalls of cavity 130. The stoppers 701 can be an oxide rich layer, or made of diamond-like carbon (DLC), SiC, or MN material.

In both embodiments, the active region 110b is an epitaxial layer on which electronic components, including the light sensing elements 120, are fabricated. The active region 110b may incorporate electronic circuits 150a, 150b for processing and selecting electronic signals generated by the light sensing elements 120. Examples of such electronic circuits 150a, 150b include buffers, address decoders, multiplexers, analog-to-digital converters and amplifiers. Typically, the electronic circuits 150a, 150b are electrically connected to the light sensing elements 120 through metal wires 145 running along and between insulating layers 140. The insulating layers 140 may be substantially composed of silicon dioxide.

A typical range of depth of the active region 110b is from 2 μm to 10 μm, while a depth of the bulk 110a typically ranges from 20 μm to 100 μm. It is desirable that the cavity base surface 135 may be located substantially close to the buried insulator 112 so that the distance traveled by the image from outside the semiconductor substrate 110 can be kept to a small value in order to reduce image signal attenuation. It follows that the cavity 130 may have a substantial depth close to the depth of the bulk 110a. The cavity base surface 135 also has a substantial area greater than an image receiving area of the light sensing elements 120. Thereby, the cavity 130 has a substantial size so that removing a body of semiconductor material from the semiconductor substrate 110 to create the cavity 130 can be accomplished by a fabrication step not limited to a mechanical grinding process and a CMP process. Preferably, etching can be used. In particular, both wet etching and dry etching can be employed. More details on fabrication of the cavity 130 will be described later.

The cavity 130 may have a sidewall that is inclined or substantially vertical. Typically, an inclined sidewall may be fabricated by wet etching or dry etching such as reactive ion etching (RIE). Under wet etching condition, the angle for the inclined sidewall is around 54.7° C. Or, a substantially vertical sidewall may be fabricated by deep reactive ion etching (DRIE) with Bosch process.

The semiconductor substrate 110 has a first substrate surface 115a and a second substrate surface 115b where the first substrate surface 115a is opposite to the second substrate surface 115b. Conventionally, the second substrate surface 115b and the first substrate surface 115a are regarded as a front side and a backside, respectively, of the semiconductor substrate 110.

Optionally, the image sensor 10 further comprises one or more first vias 160 extending from the cavity base surface 135 to the second substrate surface 115b, and one or more first electrical paths 165 between the second substrate surface 115b and the first substrate surface 115a, wherein each of the first electrical paths 165 passes through one of the first vias 160. This arrangement facilitates electronic signal communication between one or more of first devices electrically connectable to the first substrate surface 115a and one or more of second devices fabricated on the second substrate surface 115b.

It is optional that the image sensor 10 further comprises one or more second vias 167 extending from the first substrate surface 115a to the second substrate surface 115b, and one or more second electrical paths 168 between the second substrate surface 115b and the first substrate surface 115a, wherein each of the second electrical paths 168 passes through one of the second vias 167. Similarly, electronic signal communication between one or more of third devices electrically connectable to the first substrate surface 115a and one or more of fourth devices fabricated on the second substrate surface 115b is allowed. Any of the second vias 167 may have a cross-sectional area that is substantially uniform. It is also optional that any of the second vias 167 may have a substantially non-uniform cross-section area (not shown in FIG. 1).

Preferably, the image sensor 10 further comprises an anti-reflective film 170 on the cavity 130. Preferably, the anti-reflective film 170 covers at least portions of the first electrical paths 165 residing on the cavity 130. Without the anti-reflective film 170, light incident on said portions of the first electrical paths 165 or on the cavity 130 may be reflected to and captured by one or more of the micro-optical devices 155 to thereby introduce undesired interference to the light sensing elements 120 in image sensing.

Preferably, the image sensor 10 further comprises a substantially-transparent cover plate 210 attached to the first substrate surface 115a. Herein in the specification and in the appended claims, a substantially-transparent cover plate refers to a cover plate that is substantially transparent to light waves within a range of wavelengths, wherein the range of wavelengths is not limited only to the spectrum that is visible to human eyes. For example, a substantially-transparent cover plate may be substantially transparent to infrared light. Another example is that a substantially-transparent cover plate may only be substantially transparent to visible light. The substantially-transparent cover plate 210 may offer protection to the image sensor 10. Optionally, the substantially-transparent cover plate 210 is a glass plate.

It is optional that one or more fifth devices 220 which may be passive components such as decoupling capacitor or ICs such as auto-focus driver, are attached to the substantially-transparent cover plate 210 and that the substantially-transparent cover plate 210 includes one or more third vias 230, such that electrical connection can be made between the one or more fifth devices 220 and the electronic circuits 150a, 150b on the second substrate surface 115b. It follows that a high degree of device integration can be achieved as electronic devices can be dispatched on both the second substrate surface 115b and the substantially-transparent cover plate 210, thereby miniaturizing the image sensor 10.

Optionally, the image sensor 10 further comprises a handling substrate 310 attached to the second substrate surface 115b for providing additional mechanical support and protection to the image sensor 10.

Figure 2:
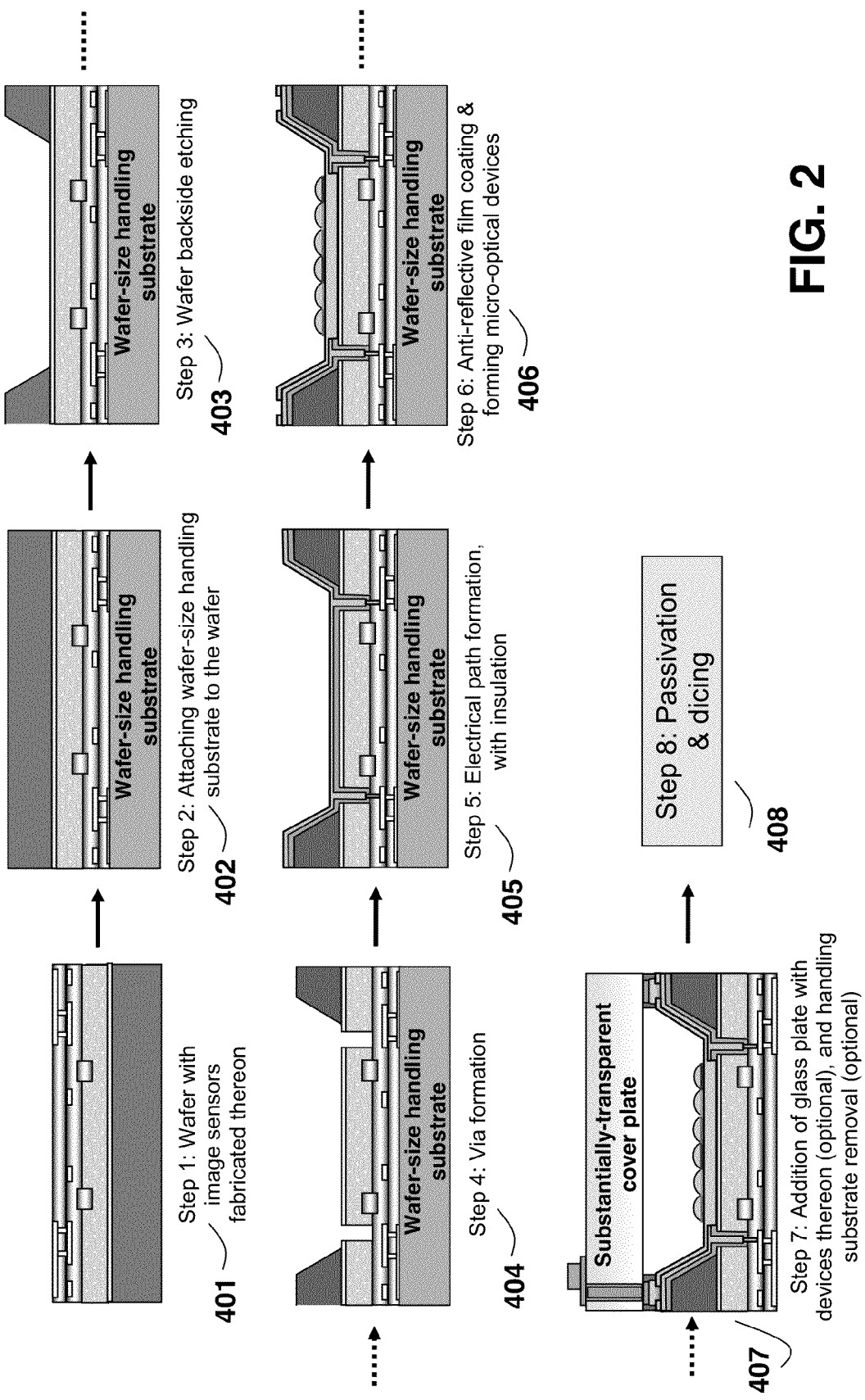
FIG. 2 shows the steps of a method for fabricating the BSI image sensor according to the present invention.

A second aspect of the present invention is to disclose a method for fabricating the disclosed image sensor. This method is illustrated with an aid from FIG. 2, which shows the steps of the method.

In a first step 401 of the method, a wafer is prepared. The wafer has a first wafer side and a second wafer side opposite to each other. Integrated circuits are fabricated on the second wafer side. The integrated circuits comprise at least light sensing elements, electronic circuits, and metal wires for at least interconnecting one or more of the electronic circuits with one or more of the light sensing elements. The wafer comprises a plurality of dice each of which contains a part of the integrated circuits, where the part of the integrated circuits contains electronic elements for realizing a BSI image sensor. Conventionally, the first wafer side and the second wafer side are regarded as a backside side and a front side, respectively, of the wafer.

In a second step 402, a wafer-size handling substrate is attached to the wafer on the second wafer side. This wafer-size handling substrate covers at least a substantial portion of the second wafer side. The wafer-size handling substrate forms a base for supporting the wafer so as to make handling of the wafer easy and convenient during carrying out subsequent steps of the method.

In a third step 403, etching is performed on the first wafer side such that the first wafer side is reshaped to form a plurality of cavities thereon. In particular, each of the cavities is a cavity for a disclosed BSI image sensor. Either wet etching or dry etching may be used. Optionally, agitation of chemical solution or addition of surfactant, such as dihexyl ester of sodium sulfosuccinic acid, may be incorporated to reduce surface roughness in the step of wet etching.

An advantage of using a SOI configuration in fabricating a disclosed image sensor is that the chance of over-etching may be reduced as an etching rate of a buried insulator can be substantially lower than an etching rate of silicon by using a suitable etchant. The method disclosed herein, however, is not limited only to the SOI configuration. In case the SOI configuration is not used, the chance of over-etching may also be reduced by noting that a bulk and an active region (having an epitaxial layer) of a semiconductor substrate have different dopant levels and that etching rates for different dopant levels can be substantially different when a suitable etchant, such as $SF_6$ with $O_2$, is selected.

In a fourth step 404 of the method, a plurality of vias from the first wafer side to the second wafer side is formed. Following the fourth step 404, a fifth step 405 of the method is to form electrical paths between the first wafer side and the second wafer side, wherein each of the electrical paths passes through one of the vias.

In a sixth step 406 of the method, a plurality of anti-reflective films on the first wafer side is formed, and a plurality of micro-optical devices on the cavities is realized. As mentioned above, preferably each of the micro-optical devices comprises a microlens and a color filter.

In an optional step 407 following the sixth step 406, a substantially-transparent cover plate with one or more second devices, for example, passive components such as decoupling capacitor or ICs such as auto-focus driver, may be attached to the image sensor, and the handling substrate may be removed from the image sensor.

In an eighth step 408, passivation on the wafer for protection is performed, and the wafer is then diced. A die obtained after the dicing is the image sensor.

Figure 4:
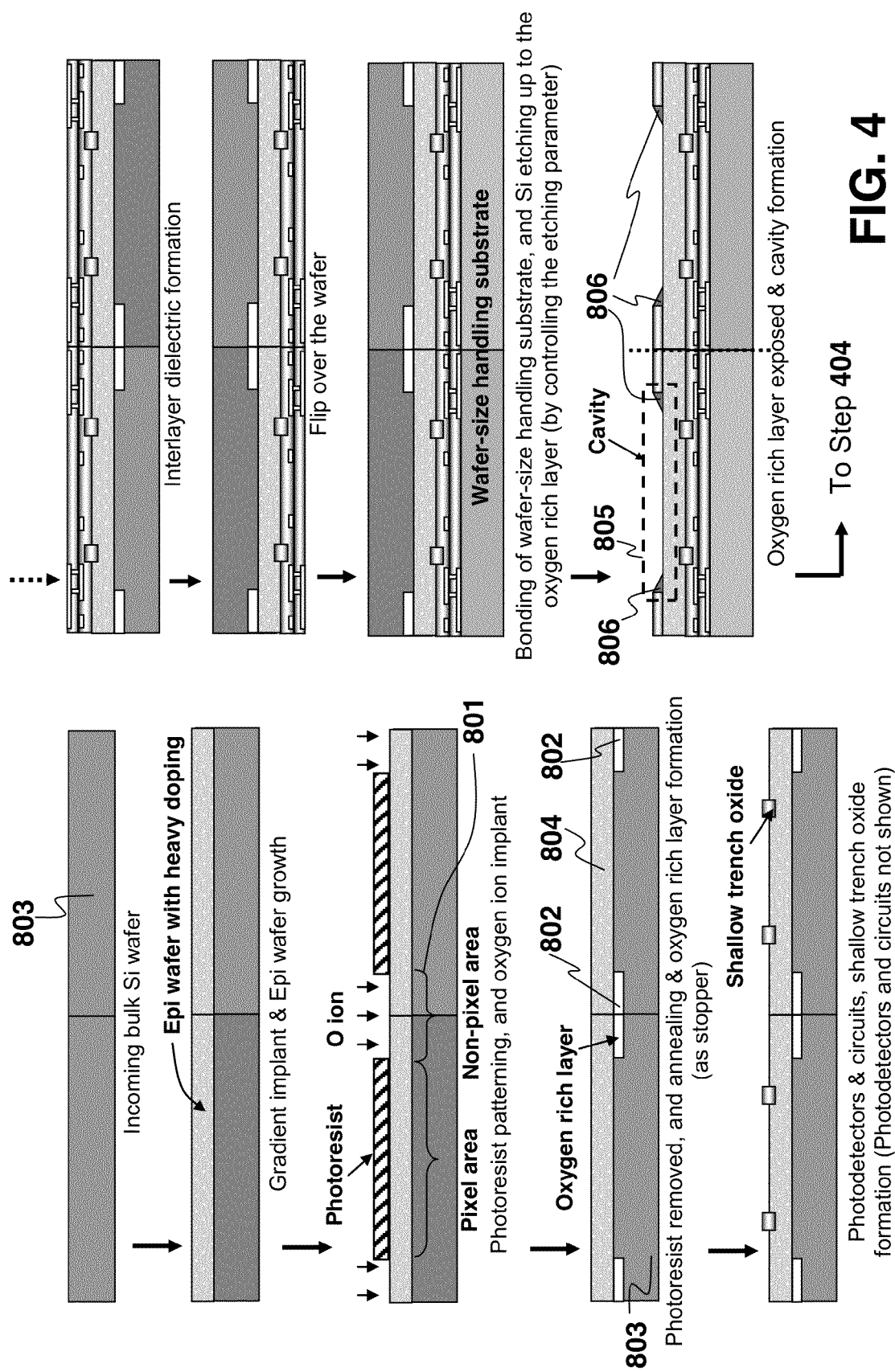
FIG. 4 shows the steps of an alternative method for fabricating the BSI image sensor according to the present invention.

Referring to FIG. 4. In an alternative embodiment that uses rings of stoppers to isolate each of the cavities, the method for fabricating the image sensor differs in the first and third steps. During the preparation of the wafer in the first step, after photoresist patterning is performed, oxygen ion implanting is made in the non-pixel areas 801. The oxygen ion implanting embeds an oxygen rich layer 802 within the bulk layer 803 and immediately bordering the heavy doping EPI wafer layer 804. In the third step, the oxygen rich layer 802 functions as stoppers for the etching, preferably wet etching or other mechanical removal methods besides etching methods, of the bulk layer 803 for cavities 805 formation. Along with the residual bulk 806, the stoppers form the sidewalls of the cavities 805. Alternatively, the stoppers may be substance such as diamond-like carbon (DLC), SiC, MN pre-embedded within the bulk layer.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A backside-illuminated image sensor comprising:
 a semiconductor substrate having a first substrate surface and a second substrate surface, the first substrate surface being opposite to the second substrate surface;
 one or more light sensing elements in the semiconductor substrate, the light sensing elements being arranged for receiving image light from outside the semiconductor substrate;
 a cavity formed in the semiconductor substrate, the cavity having a base surface overlying the light sensing elements, and the cavity extending from the first substrate surface to the base surface; and
 at least one first electrical path formed between the first substrate surface and the base surface;
 wherein the first electrical path being formed on at least a portion of a sidewall of the cavity and residing on the cavity to facilitate electronic signal communication between the first substrate surface and the base surface;
 wherein the first substrate surface being an image sensor backside; and
 wherein the image light being allowed to reach the light sensing elements through the base surface such that a distance traveled by the image light, through the semiconductor substrate, towards the image sensor backside and to the light sensing elements is shorter than it is if the cavity is absent.

2. The image sensor of claim 1, wherein the cavity being formed by etching on the semiconductor substrate.

3. The image sensor of claim 1, wherein the cavity having the sidewall comprising oxygen ion implant; wherein the oxygen ion implant serves as stoppers during etching for cavity formation in the semiconductor substrate.

4. The image sensor of claim 1, further comprising a plurality of micro-optical devices on the cavity base surface, wherein each of the micro-optical devices is configured to optically process a portion of the image light and direct the post-optically-processed portion of the image light to one of the light sensing elements.

5. The image sensor of claim 4, wherein each of the micro-optical devices comprises a microlens and a color filter.

6. The image sensor of claim 1, further comprising an anti-reflective film on the cavity.

7. The image sensor of claim 6, wherein the anti-reflective film covering the first electrical paths for avoiding undesired interference, generated from reflected incident light, to the light sensing elements.

8. The image sensor of claim 1, further comprising:
 at least one second electrical path electrically connected to the first electrical path;
 wherein the second electrical path passes through one or more first vias extending from the base surface to the second substrate surface, thereby allowing electronic signal communication between one or more of first devices on the second substrate surface and one or more of second devices electrically connectable to the first substrate surface.

9. The image sensor of claim 8, further comprising a substantially-transparent cover plate attached to the first substrate surface.

10. The image sensor of claim 8, further comprising a handling substrate attached to the second substrate surface, thereby providing additional mechanical support to the image sensor.

11. The image sensor of claim 8, wherein at least one of the first vias has a substantially uniform cross-sectional area or a substantially non-uniform cross-sectional area.

12. The image sensor of claim 9, wherein the substantially-transparent cover plate being a glass plate.

13. The image sensor of claim 9, wherein the substantially-transparent cover plate further comprising at least one second via, and one or more third devices being attached on the substantially-transparent cover plate such that the third devices are electrically connectable to the first substrate surface through the second via, or to the second substrate surface through the second via, the first electrical path and second electrical path, thereby allowing a higher degree of device integration.

14. The image sensor of claim 1, further comprising a buried insulator to separate the semiconductor substrate into a bulk serving as the sidewall of the cavity and an active region, on which one or more electronic components are fabricated.

* * * * *